United States Patent
Ahn et al.

(10) Patent No.: US 9,893,703 B2
(45) Date of Patent: Feb. 13, 2018

(54) MULTILAYER ELECTRONIC COMPONENT

(71) Applicant: SAMSUNG ELECTRO-MECHANICS CO., LTD., Suwon-si, Gyeonggi-Do (KR)

(72) Inventors: Young Ghyu Ahn, Suwon-si (KR); Byoung Hwa Lee, Suwon-si (KR); Min Cheol Park, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 60 days.

(21) Appl. No.: 14/869,205

(22) Filed: Sep. 29, 2015

(65) Prior Publication Data

US 2016/0128178 A1    May 5, 2016

(30) Foreign Application Priority Data

Nov. 4, 2014  (KR) .......................... 10-2014-0151918

(51) Int. Cl.
| | |
|---|---|
| H03H 7/01 | (2006.01) |
| H01G 4/40 | (2006.01) |
| H01F 17/00 | (2006.01) |
| H01G 4/30 | (2006.01) |
| H01G 4/35 | (2006.01) |
| H01G 4/012 | (2006.01) |
| H01G 4/232 | (2006.01) |
| H05K 1/02 | (2006.01) |
| H03H 1/00 | (2006.01) |

(52) U.S. Cl.
CPC ........... *H03H 7/0115* (2013.01); *H01F 17/00* (2013.01); *H01G 4/012* (2013.01); *H01G 4/232* (2013.01); *H01G 4/30* (2013.01); *H01G 4/35* (2013.01); *H01G 4/40* (2013.01); *H03H 7/1766* (2013.01); *H03H 2001/0085* (2013.01); *H05K 1/0233* (2013.01); *H05K 2201/1006* (2013.01)

(58) Field of Classification Search
CPC ......... H03H 2001/0085; H03H 7/0115; H03H 7/1766; H01G 4/40
USPC ............................... 333/175, 185; 361/306.3
See application file for complete search history.

(56) References Cited

U.S. PATENT DOCUMENTS

| | | | |
|---|---|---|---|
| 6,476,690 B1 * | 11/2002 | Nakata | ................ H01F 17/0013 333/184 |
| 7,688,568 B1 * | 3/2010 | Lee | ........................ H01G 4/232 361/303 |
| 2006/0209492 A1 * | 9/2006 | Togashi | ................... H01G 4/30 361/303 |

FOREIGN PATENT DOCUMENTS

| | | |
|---|---|---|
| KR | 10-2007-0039365 A | 4/2007 |
| KR | 10-0732128 B1 | 6/2007 |

* cited by examiner

*Primary Examiner* — Rakesh Patel
(74) *Attorney, Agent, or Firm* — McDermott Will & Emery LLP

(57) ABSTRACT

A multilayer electronic component includes a body including one or more ceramic layers or magnetic layers; an inductor part including coil portions disposed in the body to be perpendicular to a lower surface of the body; a plurality of internal electrodes disposed in the body to be perpendicular to the lower surface of the body; and an input terminal, an output terminal, and a ground terminal disposed on the lower surface of the body. The body includes a first capacitor part and a second capacitor part having different levels of capacitance. The first and second capacitor parts each include at least two among the plurality of internal electrodes and at least one of the ceramic layers or magnetic layers is interposed therebetween.

12 Claims, 6 Drawing Sheets

MULTILAYER ELECTRONIC COMPONENT

CROSS-REFERENCE TO RELATED APPLICATION

This application claims the benefit of priority to Korean Patent Application No. 10-2014-0151918, filed on Nov. 4, 2014 with the Korean Intellectual Property Office, the entirety of which is incorporated herein by reference.

BACKGROUND

The present disclosure relates to a multilayer electronic component and a board having the same.

In a time division multiple access (TDMA) phone, which uses a TDMA scheme, battery voltage may fluctuate when current is consumed during signal transmission.

Meanwhile, when output voltage increases, signals and noise are amplified, and a total harmonic distortion+noise (THD+N) value is deteriorated.

In addition, in terminals that use the TDMA scheme, attenuation and noise, which are major transmission faults, may also occur during data transmission.

In order to solve the above-mentioned problem, terminals which use the TDMA scheme may include ferrite beads or dedicated electro-magnetic interference (EMI) filters. However, further research into dedicated EMI filters having improved broadband attenuation characteristics and excellent noise-reduction effects is ongoing.

Meanwhile, as frequency bands of a signal and noise are close to each other, demand for a filter capable of decreasing equivalent series inductance (ESL), using high frequency, and having excellent noise-removal efficiency has increased.

RELATED ART DOCUMENT (Patent Document 1) Korean Patent Laid-Open Publication No. 10-2007-0039365

SUMMARY

One aspect of the present disclosure provides a multilayer electronic component and a board having the same.

According to one aspect of the present disclosure, a multilayer electronic component comprises a body including one or more ceramic layers or magnetic layers; an inductor part including coil portions disposed in the body, the inductor part being perpendicular to a lower surface of the body; a plurality of internal electrodes disposed in the body, the plurality of internal electrodes being perpendicular to the lower surface of the body; and an input terminal, an output terminal, and a ground terminal disposed on the lower surface of the body, wherein the body includes a first capacitor part and a second capacitor part having different levels of capacitance, the first and second capacitor parts each comprising at least two among the plurality of internal electrodes and at least one of the ceramic layers or magnetic layers interposed therebetween.

Each of the plurality of internal electrodes may have a respective lead exposed to the lower surface of the body.

The plurality of internal electrodes may include a first internal electrode, a second internal electrode, and a third internal electrode, the body may include at least two internal electrode units, each of which includes the first internal electrode, the second internal electrode, and the third internal electrode, and an area in which the first internal electrode and the third internal electrode overlap may differ from an area in which the second internal electrode and the third internal electrode overlap.

The plurality of internal electrodes may include a first internal electrode, a second internal electrode, and a third internal electrode, the first capacitor part may include the first internal electrode and the third internal electrode, and the second capacitor part may include the second internal electrode and the third internal electrode.

The first capacitor part may include at least two first sub-capacitor parts having different areas in which the first internal electrode and the third internal electrode overlap.

The second capacitor part may include at least two second sub-capacitor parts having different areas in which the second internal electrode and the third internal electrode overlap.

The plurality of internal electrodes may include a first internal electrode, a second internal electrode, and a third internal electrode, and the first internal electrode may be connected to the input terminal, the second internal electrode may be connected to the output terminal, and the third internal electrode may be connected to the ground terminal.

According to another aspect of the present disclosure, a multilayer electronic component may comprise a body including one or more ceramic layers or magnetic layers; an inductor part including coil portions disposed in the body, the inductor part being perpendicular to a lower surface of the body; a plurality of internal electrodes disposed in the body, the plurality of internal electrodes being perpendicular to the lower surface of the body; and an input terminal, an output terminal, and a ground terminal disposed on the lower surface of the body, wherein the body includes first and second capacitor parts having different levels of capacitance, the first and second capacitor parts each comprising at least two among the plurality of internal electrodes with at least one of the ceramic layers or magnetic layers interposed therebetween, the first capacitor part includes two or more first sub-capacitor parts having different overlapping areas, and the second capacitor part includes two or more second sub-capacitor parts having different overlapping areas.

The plurality of internal electrodes may include a first internal electrode, a second internal electrode, and a third internal electrode, the body may include at least two internal electrode units, each of which includes the first internal electrode, the second internal electrode, and the third internal electrode, and an area in which the first internal electrode and the third internal electrode overlap may differ from an area in which the second internal electrode and the third internal electrode overlap.

According to another aspect of the present disclosure, a board having a multilayer electronic component may include: a printed circuit board on which first to third electrode pads are provided; and the multilayer electronic component as described above mounted on the printed circuit board.

BRIEF DESCRIPTION OF DRAWINGS

The above and other aspects, features and advantages of the present disclosure will be more clearly understood from the following detailed description taken in conjunction with the accompanying drawings.

DETAILED DESCRIPTION

Figure 1:
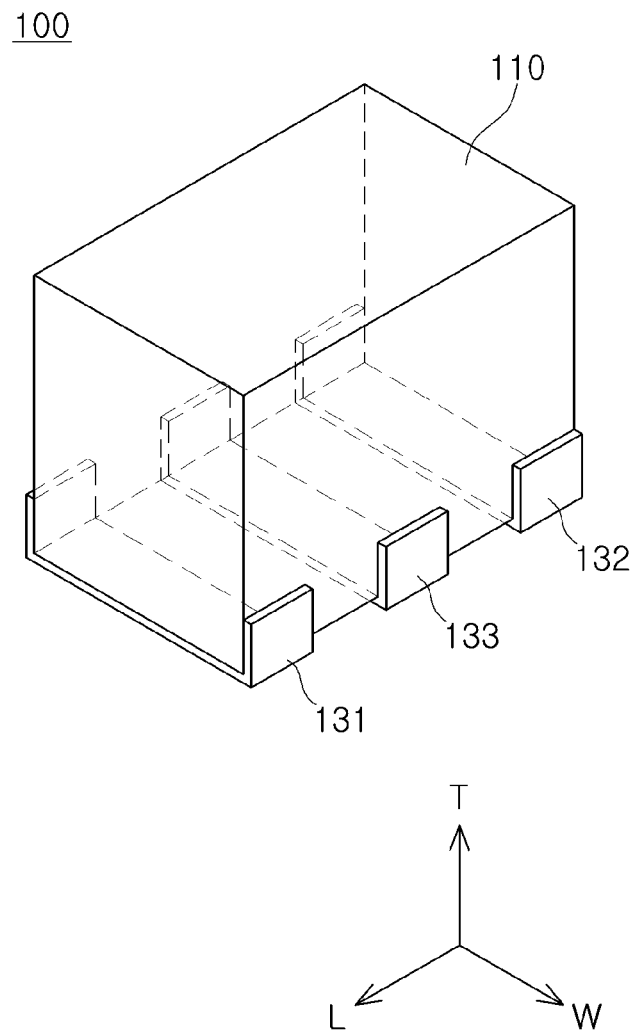
FIG. 1 is a perspective view of a multilayer electronic component according to a first exemplary embodiment.

Hereinafter, embodiments of the present disclosure will be described in detail with reference to the accompanying drawings. The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art. In the drawings, the shapes and dimensions of elements may be exaggerated for clarity, and the same reference numerals will be used throughout to designate the same or like elements.

Directions of a hexahedron will be defined in order to clearly describe exemplary embodiments in the present disclosure. L, W, and T illustrated in the accompanying drawings refer to a length direction, a width direction, and a thickness direction, respectively. Here, a width direction refers to a direction in which dielectric layers or magnetic layers are layered, and a thickness direction refers to a direction perpendicular to the direction in which the dielectric layers or the magnetic layers are layered.

Multilayer Electronic Component

Hereinafter, exemplary embodiments in the present disclosure will be described in detail with reference to the accompanying drawings.

FIG. 1 is a perspective view of a multilayer electronic component according to a first exemplary embodiment.

Figure 2:
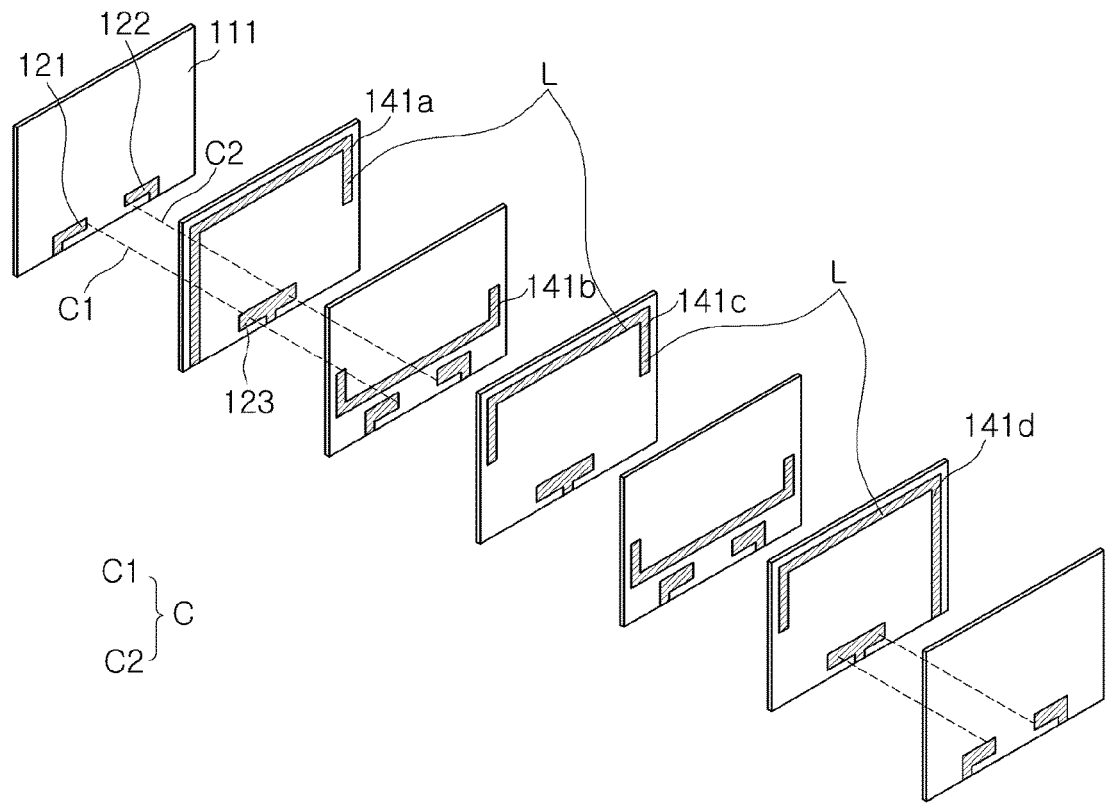
FIG. 2 is an exploded perspective view of first to fourth coil portions and first to third internal electrodes that may be used in the multilayer electronic component illustrated in FIG. 1.

FIG. 2 is an exploded perspective view of first to fourth coil portions and first to third internal electrodes that may be used in the multilayer electronic component illustrated in FIG. 1.

Referring to FIGS. 1 and 2, a multilayer electronic component 100, according to the first exemplary embodiment, may include a body 110 including one or more dielectric and/or magnetic layers 111 and an input terminal 131, an output terminal 132, and a ground terminal 133 disposed on a lower surface of the body 110.

In the present exemplary embodiment, the body 110 may have upper and lower surfaces opposing each other, and first and second end surfaces in the length direction and first and second side surfaces in the width direction that connect the upper and lower surfaces to each other.

A shape of the body 110 is not particularly limited, but may be hexahedral as illustrated.

The body 110 may include one or more dielectric and/or magnetic layers 111, and may be formed by stacking a plurality of dielectric and/or magnetic layers 111.

The plurality of dielectric and/or magnetic layers 111 forming the body 110 may be sintered together and may be integrated with each other so that boundaries between adjacent dielectric and/or magnetic layers 111 are not readily apparent.

The dielectric layers forming the body 110 may be formed by sintering ceramic green sheets containing ceramic powder, an organic solvent, and an organic binder. The ceramic powder, which may be a high k-material, may be a barium titanate ($BaTiO_3$) based material, a strontium titanate ($SrTiO_3$) based material, or the like, but is not limited thereto.

The magnetic layers forming the body 110 may be formed of an Ni—Cu—Zn based ferrite material, an Ni—Cu—Zn—Mg based ferrite material, an Mn—Zn based ferrite material, or an Fe—Si—B—Cr based amorphous metal powder material, which is a metal-based soft magnetic material. However, a material of the magnetic layers is not limited thereto.

One or more dielectric and/or magnetic layers 111 may form the body 110. That is, the body 110 may be formed using the dielectric and/or magnetic layers 111, alone or in combination.

For example, in a case in which the body 110 includes the magnetic layers 111, an inductor part may have the form of a ferrite bead as will be described below.

According to the first exemplary embodiment, the input terminal 131, the output terminal 132, and the ground terminal 133 may be disposed on the lower surface of the body 110.

The multilayer electronic component 100, according to the first exemplary embodiment, may be a dedicated electromagnetic interference (EMI) filter which may improve noise removal efficiency, and excellent noise reduction may be obtained in a terminal which uses a time division multiple access (TDMA) scheme.

The multilayer electronic component 100, according to the first exemplary embodiment, may receive a signal through the input terminal 131 disposed on the lower surface of the body 110, remove noise from the received signal through the ground terminal 133, and output a signal, from which the noise has been removed, through the output terminal 132.

The input terminal 131, the output terminal 132, and the ground terminal 133 may be disposed on the lower surface of the body 110 and may extend to both side surfaces of the body 110.

In addition, referring to FIG. 1, the input terminal 131 and the output terminal 132 may be disposed to coincide with both end surfaces of the body 110. However, the input terminal 131 and the output terminal 132 are not limited to being disposed as described above, and may alternatively be disposed to be spaced apart from both end surfaces of the body 110 by a predetermined distance.

Furthermore, although not illustrated in FIG. 1, additional external terminals may also be disposed on the upper surface of the body 110, in addition to the input terminal 131, the output terminal 132, and the ground terminal 133 disposed on the lower surface of the body 110.

According to the first exemplary embodiment, a mounted surface of the multilayer electronic component 100 may be the lower surface of the body 110.

The input terminal 131, the output terminal 132, and the ground terminal 133 may be formed of a conductive paste containing a conductive metal.

The conductive metal may be nickel (Ni), copper (Cu), tin (Sn), or an alloy thereof, but is not limited thereto.

The conductive paste may further contain an insulating material. The insulating material may be, for example, glass, but is not limited thereto.

A method of forming the input terminal 131, the output terminal 132, and the ground terminal 133 is not particularly limited. That is, the input terminal 131, the output terminal 132, and the ground terminal 133 may be formed on the body by a printing method, a dipping method, a plating method, or the like.

A plating layer may later be formed on the input terminal 131, the output terminal 132, and the ground terminal 133.

The multilayer electronic component 100 may be a three-terminal LC filter having the input terminal 131, the output terminal 132, and the ground terminal 133, but is not limited thereto.

Referring to FIG. 2, the multilayer electronic component 100, according to the first exemplary embodiment, may include an inductor part L including coil portions 141a, 141b, 141c, and 141d disposed in the body 110 to be perpendicular to the lower surface of the body 110 and a capacitor part C including a plurality of internal electrodes 121 to 123 disposed in the body 110 to be perpendicular to the lower surface of the body 110.

The inductor part L may be manufactured by printing thick electrodes on thin ferrite or glass ceramic sheets, stacking several sheets on which a coil pattern is printed, and connecting internal conducting wires to each other through vias.

That is, the inductor part may be formed by disposing the coil portions 141a, 141b, 141c, and 141d on the one or more dielectric and/or the magnetic layers 111 and connecting the coil portions 141a, 141b, 141c, and 141d to each other through vias (not illustrated).

The coil portions 141a, 141b, 141c, and 141d may be disposed in the body 110 to be perpendicular to the lower surface of the body 110, but are not limited thereto.

According to the first exemplary embodiment, the inductor part may be a ferrite bead capable of removing only a noise component without having a large influence on a basic wave of a signal even when frequencies of the basic wave and the noise component of the signal are close to each other.

Although the number of each coil portion 141a, 141b, 141c, or 141d illustrated in FIG. 2 is one or two, it is not particularly limited in an actual application.

In addition, the shape of a pattern of the coil portions 141a, 141b, 141c, and 141d illustrated in FIG. 2 is only depicted by way of example, and may vary in order to adjust inductance.

The coil may include first to fourth coil portions 141a, 141b, 141c, and 141d. The first coil portion 141a may be exposed to the lower surface of the body 110 and be connected to the input terminal 131.

In addition, the fourth coil portion 141d may be exposed to the lower surface of the body 110 and be connected to the output terminal 132.

The capacitor part C may be formed by including the plurality of internal electrodes 121 to 123 formed on the one or more dielectric and/or magnetic layers 111.

The internal electrodes 121 to 123 may be disposed in the body 110 to be perpendicular to the lower surface of the body 110, but are not limited thereto.

According to the first exemplary embodiment, the capacitor part C together with the inductor part having the form of the ferrite bead may form a single electronic component to serve as a filter which removes noise components, and may, for example, be a low capacitance multilayer ceramic capacitor in which there is a small overlapping area between the internal electrodes facing each other with each of the dielectric and/or magnetic layers interposed therebetween.

FIG. 2 illustrates that four first internal electrodes 121, four second internal electrodes 122, and three third internal electrodes 123, but the number of internal electrodes is not particularly limited in an actual application. That is, the number of internal electrodes may be varied. In addition, the internal electrodes 121 and 122 may have the same shape as illustrated in FIG. 2. Alternatively, the internal electrodes 121 and 122 may have different shapes.

In addition, the shape of a pattern composed of the internal electrodes 121 to 123 illustrated in FIG. 2 is only depicted by way of example, and may vary in order to adjust capacitance.

The first and second internal electrodes 121 and 122 may be formed on each of the dielectric and/or magnetic layers 111 to be spaced apart from each other, and the shape of the pattern of the first and second internal electrodes 121 and 122 may be the same. However, the shape of the pattern of the first and second internal electrodes 121 and 122 is not limited thereto.

The third internal electrode 123 may face the first and second internal electrodes 121 and 122 with at least one of the dielectric and/or magnetic layers interposed therebetween, and an overlapping area in which the first and third internal electrodes 121 and 123 face each other may differ from an overlapping area in which the second and third internal electrodes 122 and 123 face each other, as described above.

That is, according to the exemplary embodiment, the body 110 may include first and second capacitor parts C1 and C2 having different levels of capacitance determined by the plurality of internal electrodes 121 to 123 facing each other with at least one of the dielectric and/or magnetic layers 111 interposed therebetween.

In addition, the body 110 may include at least two or more internal electrode units, each of which includes the first to third internal electrodes 121 to 123, wherein an overlapping area in which the first and third internal electrodes 121 and 123 face each other may differ from an overlapping area in which the second and third internal electrodes 122 and 123 face each other.

Figure 3:
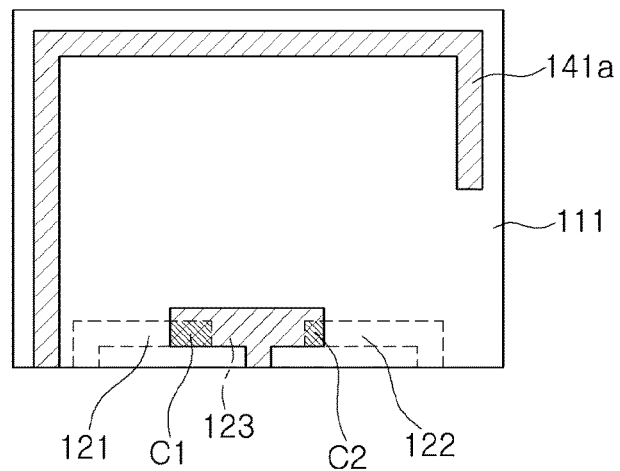
FIG. 3 is a plan view of the first to third internal electrodes illustrated in FIG. 2.

FIG. 3 is a plan view of the first to third internal electrodes illustrated in FIG. 2.

Referring to FIG. 3, a first capacitor part C1 may be formed by the first and third internal electrodes 121 and 123 facing each other, and a second capacitor part C2 may be formed by the second and third internal electrodes 122 and 123 facing each other.

Here, an overlapping area in which the first and third internal electrodes 121 and 123 forming the first capacitor part C1 face each other may differ from an overlapping area in which the second and third internal electrodes 122 and 123 forming the second capacitor part C2 face each other, so that levels of capacitance of the first and second capacitor parts C1 and C2 may vary.

The multilayer electronic component, according to the first exemplary embodiment, may include the first and second capacitor parts C1 and C2 having different levels of capacitance, whereby broadband attenuation characteristics improving the noise-removal efficiency may be improved in the terminal using the TDMA scheme.

In addition, the plurality of internal electrodes 121 to 123 may be disposed in the body 110 to be perpendicular to the lower surface of the body 110 and may have respective leads exposed to the lower surface of the body 110.

The plurality of internal electrodes 121 to 123 may have the leads exposed to the lower surface of the body 110, respectively, such that equivalent series inductance (ESL) of the capacitor part may be decreased, whereby the broadband attenuation characteristics of the multilayer electronic component may be improved.

When the multilayer electronic component is mounted on a circuit board to be perpendicular to the circuit board, a current may directly flow between electrode pads of the board and the internal electrodes through the ground terminal without a separate current path, whereby the ESL of the capacitor part may be reduced.

In addition, in an EMI filter, ESL of a capacitor needs to be low in order to improve broadband attenuation characteristics. According to the first exemplary embodiment, the multilayer electronic component has a structure in which the ESL of the capacitor part is reduced as described above, and the above-mentioned effect may be obtained.

Meanwhile, the first to third internal electrodes 121 to 123 may be connected to the input terminal 131, the output terminal 132, and the ground terminal 133, respectively.

Figure 4:
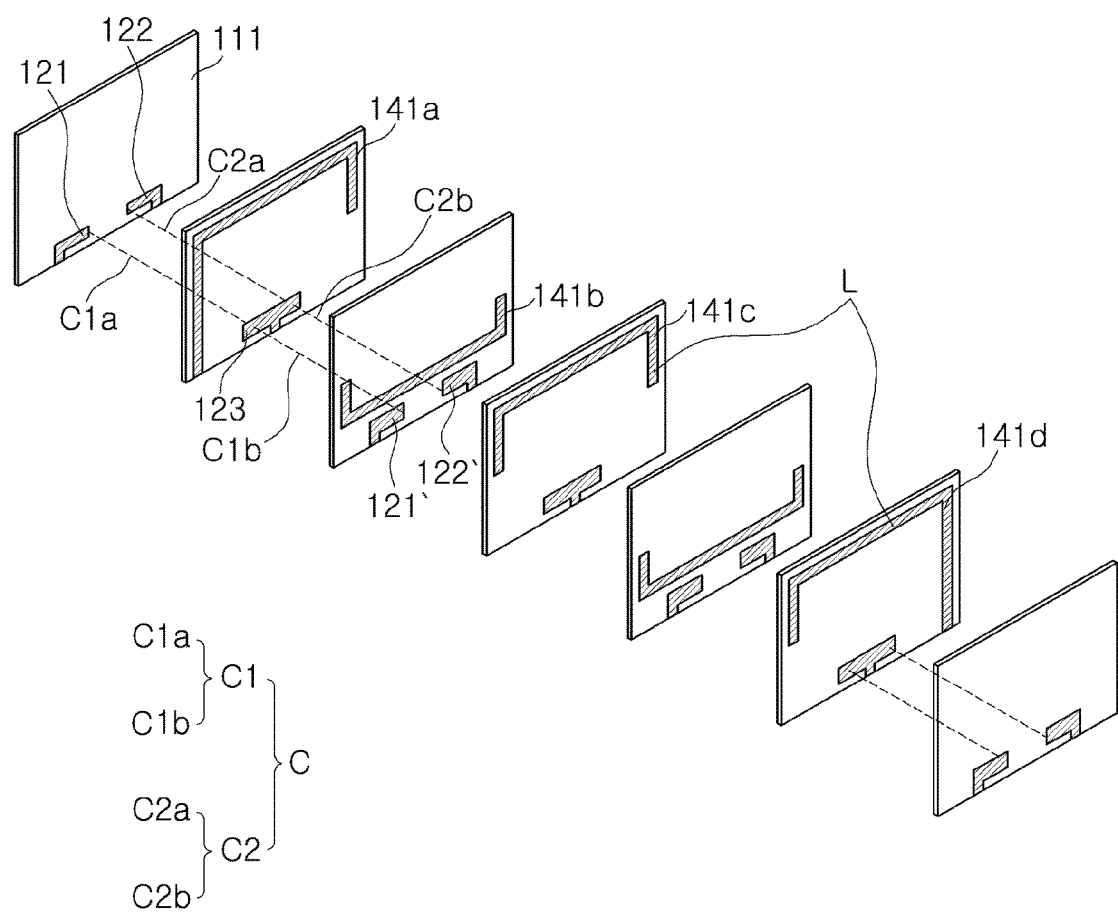
FIG. 4 is an exploded perspective view of first to fourth coil portions and first to third internal electrodes that may be used in a multilayer electronic component according to another exemplary embodiment.

FIG. 4 is an exploded perspective view of first to fourth coil portions and first to third internal electrodes that may be used in a multilayer electronic component according to another exemplary embodiment.

Figure 5A:
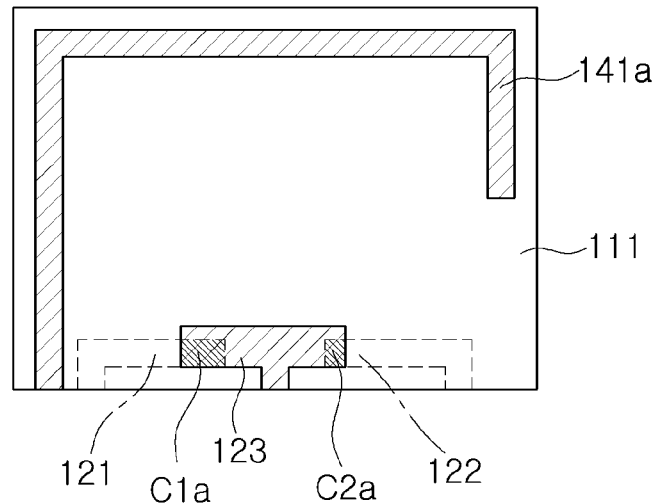
FIGS. 5A and 5B are plan views of the first to third internal electrodes illustrated in FIG. 4.
Figure 5B:
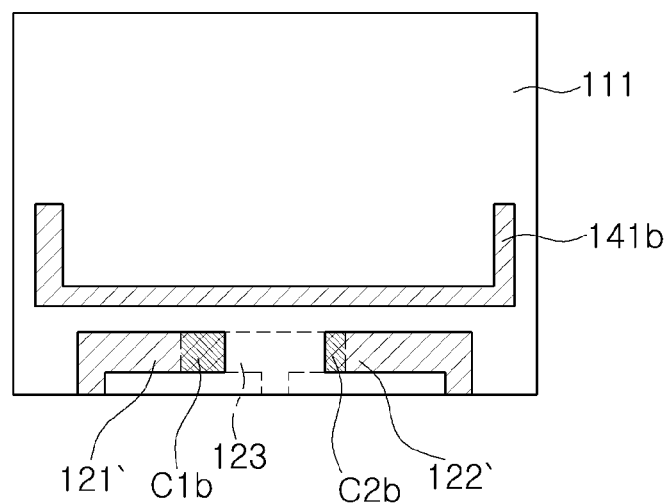

FIGS. 5A and 5B are plan views of the first to third internal electrodes illustrated in FIG. 4.

Referring to FIGS. 4 through 5B, in the multilayer electronic component according to another exemplary embodiment, the first capacitor part C1 may include two or more first sub-capacitor parts C1a and C1b having different overlapping areas in which an overlapping area in which the first internal electrode 121 and the third internal electrode 123 face each other differs from an overlapping area in which a first internal electrode 121' and the third internal electrode 123 face each other, and the second capacitor part C2 may include two or more second sub-capacitor parts C2a and C2b having different overlapping areas in which an overlapping area in which the second internal electrode 122 and the third internal electrode 123 face each other differs from an overlapping area in which a second internal electrode 122' and the third internal electrode 123 face each other, in addition to the aforementioned features of the multilayer electronic component according to the first exemplary embodiment.

In the first sub-capacitor parts C1a and C1b, the overlapping area in which the first internal electrode 121 and the third internal electrode 123 face each other may differ from the overlapping area in which the first internal electrode 121' formed on another dielectric or magnetic layer 111 and the third internal electrode 123 face each other, so that levels of capacitance of the first sub-capacitor parts C1a and C1b may vary.

The overlapping areas of the internal electrodes facing each other may vary according to widths, thicknesses, or both of the widths and the thicknesses of overlapping areas of the internal electrodes, and shapes of the overlapping areas of the internal electrodes facing each other are not particularly limited.

Likewise, in the second sub-capacitor parts C2a and C2b, the overlapping area in which the first internal electrode 122 and the third internal electrode 123 face each other may differ from the overlapping area in which the second internal electrode 122' formed on another dielectric or magnetic layer 111 and the third internal electrode 123 face each other vary, so that levels of capacitance of the second sub-capacitor parts C2a and C2b may vary.

According to another exemplary embodiment in the present disclosure, the multilayer electronic component may include the first sub-capacitor parts C1a and C1b having different levels of capacitance and/or the second sub-capacitor parts C2a and C2b having different levels of capacitance, as described above, whereby the broadband attenuation characteristics as well as the noise-removal efficiency may be improved.

FIGS. 4 through 5B illustrate that two first sub-capacitor parts C1a and C1b and two second sub-capacitor parts C2a and C2b disposed in the body 110 and having the different levels of capacitance, but the number of each of first and second sub-capacitor parts included in the body 110 and having different levels of capacitance is not particularly limited (e.g., C1a, C1b, C1c . . . , C2a, C2b, C2c . . . ).

The multilayer electronic component 100 may have a structure in which the ferrite bead forming the inductor part and the multilayer ceramic capacitors forming the capacitor part are coupled to each other. The inductor part and the capacitor part may be connected in parallel with each other.

Therefore, even when the frequencies of the basic wave and the noise component of the signal in the inductor part are close to each other, only the noise component may be removed without having a large influence on the basic wave, and the capacitor part may have reduced ESL and include a plurality of capacitors having different levels of capacitance, whereby the broadband attenuation characteristics may be improved.

Figure 6:
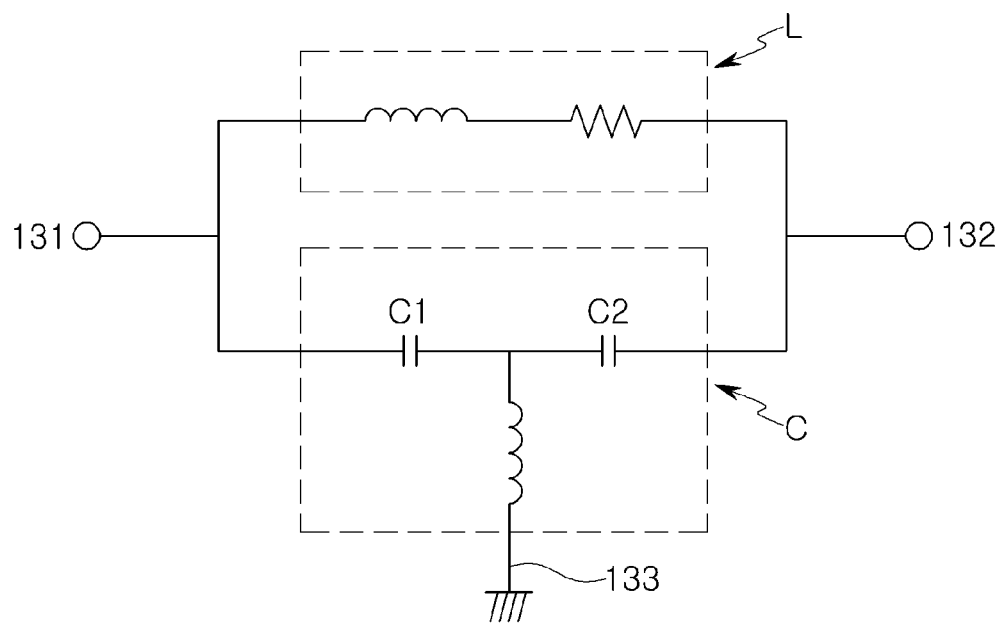
FIG. 6 is an equivalent circuit diagram of the multilayer electronic component illustrated in FIG. 1.

FIG. 6 is an equivalent circuit diagram of the multilayer electronic component illustrated in FIG. 1.

Referring to FIG. 6, the multilayer electronic component 100, according to the first exemplary embodiment, may receive a signal through the input terminal 131 disposed on the lower surface of the body 110, remove the noise from the received signal through the ground terminal 133, and output the signal, from which the noise has been removed, through the output terminal 132.

The noise may be removed by the inductor part L and the capacitor part C included in the multilayer electronic component 100, and the removed noise may exit through the ground terminal 133.

The capacitor part C may include two capacitors C1 and C2 having different levels of capacitance. However, the capacitor part C is not limited to including the two capacitors C1 and C2, but may include three or more capacitors having different levels of capacitance.

In addition, the capacitor part may have an ESL component between the capacitor part and the ground terminal 133.

As described above, the multilayer electronic component, according to the first exemplary embodiment, may include an inductor and a plurality of capacitors having different levels of capacitance. Levels of inductance of the inductor and capacitance of the plurality of capacitors may be individually controlled.

The multilayer electronic component having the above-mentioned structure, according to the first exemplary embodiment, may provide excellent noise removal even when the frequency bands of the noise and the signal are close to each other, and may have improved broadband attenuation characteristics.

In addition, in a terminal using a TDMA scheme, attenuation and noise, which are major transmission faults, may occur during data transmission. However, the multilayer electronic component, according to the first exemplary embodiment, may solve the above-mentioned problem by serving as a dedicated EMI filter providing excellent noise reduction.

Meanwhile, a multilayer electronic component 100, according to a second exemplary embodiment, may include a body 110 including one or more ceramic and/or magnetic layers 111; an inductor part L including coil portions 141a, 141b, 141c, and 141d disposed in the body 110 to be perpendicular to a lower surface of the body 110; a plurality of internal electrodes 121, 121', 122, 122', and 123 disposed in the body 110 to be perpendicular to the lower surface of the body 110; and an input terminal 131, an output terminal 132, and a ground terminal 133 disposed on the lower surface of the body 110, wherein the body 110 includes first and second capacitor parts C1 and C2 formed by the plurality of internal electrodes 121, 121', 122, 122', and 123 facing each other with at least one of the ceramic and/or magnetic layers 111 interposed therebetween, the first capacitor part C1 including two or more first sub-capacitor parts C1a and C1b having different overlapping areas in which the plurality of internal electrodes 121, 121', and 123 face each other, and the second capacitor part C2 including two or more second sub-capacitor parts C2a and C2b having different overlapping areas in which the plurality of internal electrodes 122, 122', and 123 face each other.

The plurality of internal electrodes may include first to third internal electrodes 121, 121', 122, 122', and 123, and form at least two or more internal electrode units, each of which having different overlapping areas wherein an overlapping area in which the first internal electrodes 121 and 121' and the third internal electrode 123 face each other may differ from an overlapping area in which the second internal electrodes 122 and 122' and the third internal electrode 123 face each other.

According to the second exemplary embodiment, even when the frequency bands of noise and a signal are close to each other, excellent noise removal may be provided and broadband attenuation characteristics may be improved.

Since features of the multilayer electronic component according to the second exemplary embodiment other than the above-mentioned features thereof are the same as those of the multilayer electronic component according to the first exemplary embodiment, a description thereof will be omitted.

Meanwhile, a multilayer electronic component 100, according to a third exemplary embodiment, may include: a signal input part; a noise-removal part removing noise from a signal which is input from the signal input part; and a signal output part outputting a signal from which the noise has been removed, wherein the noise-removal part includes a body 110 including one or more ceramic and/or magnetic layers 111, an inductor part L including coil portions 141a, 141b, 141c, and 141d, and a capacitor part C including a plurality of internal electrodes 121, 122, and 123, the capacitor part including first and second capacitor parts C1 and C2 having different levels of capacitance determined by the plurality of internal electrodes 121, 122, and 123 facing each other with at least one of the ceramic and/or the magnetic layers 111 interposed therebetween.

The signal input part corresponds to the input terminal 131 of the multilayer electronic component according to the first to third exemplary embodiments, and the signal output part corresponds to the output terminal 132 of the multilayer electronic component, according to the first to third exemplary embodiments.

The coil portions 141a, 141b, 141c, and 141d may be disposed in the body 110 to be perpendicular to a lower surface of the body 110, and the plurality of internal electrodes 121 to 123 may be disposed in the body 110 to be perpendicular to the lower surface of the body 110.

Since features of the multilayer electronic component according to the third exemplary embodiment other than the above-mentioned features thereof are the same as those of the multilayer electronic component according to the first and second exemplary embodiments, a description thereof will be omitted.

Board Having Multilayer Electronic Component

Figure 7:
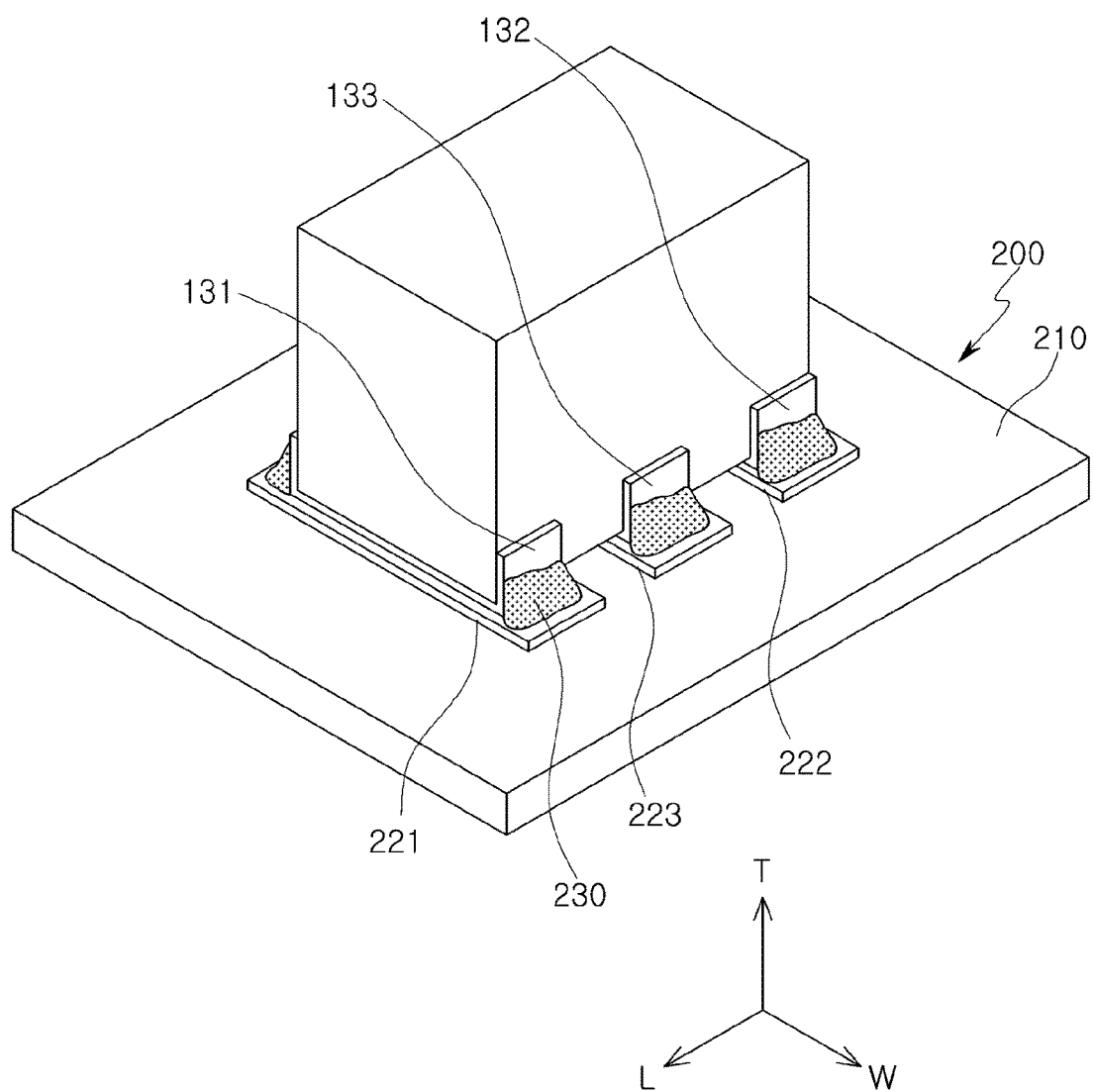
FIG. 7 is a perspective view of a board in which the multilayer electronic component of FIG. 1 is mounted on a printed circuit board.

FIG. 7 is a perspective view illustrating a board in which the multilayer electronic component of FIG. 1 is mounted on a printed circuit board.

Referring to FIG. 7, a board 200 having a multilayer electronic component 100, according to the present exemplary embodiment, may include a printed circuit board 210 on which the multilayer electronic component 100 is mounted while the coil portions and the internal electrodes thereof are perpendicular to the printed circuit board 210; and first to third electrode pads 221 to 223 disposed on the printed circuit board 210 to be spaced apart from each other.

Here, the multilayer electronic component 100 may be electrically connected to the printed circuit board 210 by solders 230 in a state in which the input terminal 131, the output terminal 132, and the ground terminal 133 thereof are positioned to contact the first to third electrode pads 221 to 223, respectively.

A description of features which overlap those of the multilayer electronic component according to the first exemplary embodiment, except for the above-mentioned description, will be omitted.

As set forth above, in a multilayer electronic component, according to the exemplary embodiments, a bead and low capacitance multilayer ceramic capacitors are combined to form a single electronic component, and levels of capacitance are changed according to the low capacitance multilayer ceramic capacitors, whereby broadband attenuation characteristics may be improved.

In addition, when being mounted perpendicularly to a circuit board, the low capacitance multilayer ceramic capacitors have reduced ESL, whereby attenuation characteristics may be improved.

While exemplary embodiments have been shown and described above, it will be apparent to those skilled in the art that modifications and variations could be made without departing from the scope of the present invention as defined by the appended claims.

What is claimed is:

1. A multilayer electronic component comprising:
   a body including one or more ceramic layers or magnetic layers;
   an inductor part including coil portions disposed in the body, the inductor part being perpendicular to a lower surface of the body;
   a plurality of internal electrodes disposed in the body, the plurality of internal electrodes being perpendicular to the lower surface of the body; and
   an input terminal, an output terminal, and a ground terminal disposed on the lower surface of the body,
   wherein the body includes a first capacitor part and a second capacitor part having different levels of capacitance, the first and second capacitor parts each comprising at least two among the plurality of internal electrodes and at least one of the ceramic layers or magnetic layers interposed therebetween, and
   the inductor part is connected in parallel with the first and second capacitor parts.

2. The multilayer electronic component of claim 1, wherein each of the plurality of internal electrodes has a respective lead exposed to the lower surface of the body.

3. The multilayer electronic component of claim 1, wherein the plurality of internal electrodes includes a plurality of first internal electrodes, a plurality of second internal electrodes, and a plurality of third internal electrodes, the body includes at least two internal electrode units, each of which includes at least one of the plurality of first internal electrodes, at least one of the plurality of second internal electrodes, and at least one of the plurality of third internal electrodes, and in each of the at least two internal electrode units, an area in which the first internal electrode and the third internal electrode overlap differs from an area in which the second internal electrode and the third internal electrode overlap.

4. The multilayer electronic component of claim 1, wherein the plurality of internal electrodes includes a first internal electrode, a second internal electrode, and a third internal electrode, the first capacitor part includes the first internal electrode and the third internal electrode, and the second capacitor part includes the second internal electrode and the third internal electrode.

5. The multilayer electronic component of claim 4, wherein the first capacitor part includes two or more first sub-capacitor parts having different areas in which the first internal electrode and the third internal electrode overlap.

6. The multilayer electronic component of claim 4, wherein the second capacitor part includes two or more second sub-capacitor parts having different areas in which the second internal electrode and the third internal electrode overlap.

7. The multilayer electronic component of claim 1, wherein the plurality of internal electrodes includes a first internal electrode, a second internal electrode, and a third internal electrode, and the first internal electrode is connected to the input terminal, the second internal electrode is connected to the output terminal, and the third internal electrode is connected to the ground terminal.

8. The multilayer electronic component of claim 1, wherein at least one of the ceramic layers or the magnetic layers includes one of the coil portions and one of the internal electrodes disposed thereon.

9. A multilayer electronic component comprising:

a body including one or more ceramic layers or magnetic layers;

an inductor part including coil portions disposed in the body, the inductor part being perpendicular to a lower surface of the body;

a plurality of internal electrodes disposed in the body, the plurality of internal electrodes being perpendicular to the lower surface of the body; and an input terminal, an output terminal, and a ground terminal disposed on the lower surface of the body, wherein the body includes first and second capacitor parts having different levels of capacitance, the first and second capacitor parts each comprising at least two among the plurality of internal electrodes with at least one of the ceramic layers or magnetic layers interposed therebetween, the first capacitor part includes two or more first sub-capacitor parts having different overlapping areas, and the second capacitor part includes two or more second sub-capacitor parts having different overlapping areas, and the inductor part is connected in parallel with the first and second capacitor parts.

10. The multilayer electronic component of claim 9, wherein the plurality of internal electrodes includes a first internal electrode, a second internal electrode, and a third internal electrode, and the first internal electrode is connected to the input terminal, the second internal electrode is connected to the output terminal, and the third internal electrode is connected to the ground terminal.

11. The multilayer electronic component of claim 9, wherein the plurality of internal electrodes includes a plurality of first internal electrodes, a plurality of second internal electrodes, and a plurality of third internal electrodes, the body includes at least two internal electrode units, each of which includes at least one of the plurality of first internal electrodes, at least one of the plurality of second internal electrodes, and at least one of the plurality of third internal electrodes, and in each of the at least two internal electrode units, an area in which the first internal electrode and the third internal electrode overlap differs from an area in which the second internal electrode and the third internal electrode overlap.

12. The multilayer electronic component of claim 9, wherein at least one of the ceramic layers or the magnetic layers includes one of the coil portions and one of the internal electrodes disposed thereon.

* * * * *